(12) United States Patent
Adachi

(10) Patent No.: US 8,652,863 B2
(45) Date of Patent: Feb. 18, 2014

(54) METHOD OF MANUFACTURING AN OPTICAL MATRIX DEVICE

(75) Inventor: Susumu Adachi, Hirakata (JP)

(73) Assignee: Shimadzu Corporation, Kyoto (JP)

( * ) Notice: Subject to any disclaimer, the term of this patent is extended or adjusted under 35 U.S.C. 154(b) by 287 days.

(21) Appl. No.: 13/133,319

(22) PCT Filed: Oct. 29, 2009

(86) PCT No.: PCT/JP2009/005746
§ 371 (c)(1),
(2), (4) Date: Jun. 7, 2011

(87) PCT Pub. No.: WO2010/070802
PCT Pub. Date: Jun. 24, 2010

(65) Prior Publication Data
US 2011/0244614 A1     Oct. 6, 2011

(30) Foreign Application Priority Data

Dec. 18, 2008  (WO) .................. PCT/JP2008/073113

(51) Int. Cl.
*H01L 31/0264*     (2006.01)
(52) U.S. Cl.
USPC .............................................. 438/34; 438/73

(58) Field of Classification Search
USPC .......................................... 438/34–35, 73, 75
See application file for complete search history.

(56) References Cited

U.S. PATENT DOCUMENTS

2010/0243893 A1*   9/2010   Yoshimuta .................. 250/336.1

FOREIGN PATENT DOCUMENTS

JP            2004-349583 A     12/2004

* cited by examiner

*Primary Examiner* — Mamadou Diallo
(74) *Attorney, Agent, or Firm* — Cheng Law Group, PLLC

(57) ABSTRACT

According to the method of manufacturing an optical matrix device of this invention, semiconductor films and gate insulating films which influence the characteristics of thin-film transistors most are formed in a vacuum (S12, S13), whereby the interfaces between the semiconductor films and gate insulating films are not contaminated. The semiconductor films and gate insulating films are formed in a vacuum, but wires need not be formed in a vacuum (S03). Thus, the semiconductor films and gate insulating films formed in a vacuum are transferred onto the wires formed beforehand (S21). Even if a substrate has a large area, the wires, semiconductor films and gate insulating films of the thin-film transistors can be formed efficiently.

12 Claims, 14 Drawing Sheets

METHOD OF MANUFACTURING AN OPTICAL MATRIX DEVICE

TECHNICAL FIELD

This invention relates to a method of manufacturing an optical matrix device having a structure of pixels formed of display elements or light receiving elements and arranged in a two-dimensional matrix form, such as a thin image display device used as a television or a monitor of a personal computer, or a radiation detector provided for a radiographic apparatus used in the medical field, industrial field, or the like.

BACKGROUND ART

An optical matrix device with a two-dimensional matrix arrangement of elements relating to light and having active elements formed of thin-film transistors (TFTs) or the like and capacitors is in wide use today. Light receiving elements and display elements may be cited as examples of the elements relating to light. This optical matrix device is divided roughly into a device formed of light receiving elements, and a device formed of display elements. The device formed of light receiving elements includes an optical image sensor, and a radiation image sensor used in the medical field, industrial field or the like. The device formed of display elements includes an image display used as a television or a monitor of a personal computer, such as the liquid crystal type having elements which adjust the intensity of transmitted light and the EL type having light emitting elements. Light here refers to infrared light, visible light, ultraviolet light, radiation (X-rays, gamma rays) and so on.

In recent years, a method of using the inkjet technique has been studied vigorously as a method of forming wires of an active matrix substrate provided for such an optical matrix device. The inkjet technique can form not only the wires such as gate lines and data lines of the active matrix substrate, but also semiconductors such as gate channels. It is very useful in that, unlike the conventional photolithographic technique, it can carry out direct printing and does not need photomasks. For such reasons, this technique is expected to realize active matrix substrates of large area.

With the inkjet printing technique, semiconductor film, insulator film or conducting wires can be formed by carrying out printing and coating of droplets (ink) containing semiconductor, insulator or conductive particles on an insulating substrate. Droplets ejected from an ink jet nozzle are maintained as a solution or in a colloidal state by dissolving or dispersing either the semiconductor, insulator or conductive particles in an organic solvent. And after printing and coating these droplets, the organic solvent is volatized by heating treatment to form semiconductor film, insulator film or conducting wires (wiring).

Patent Document 1, for example, discloses a thin-film transistor manufacturing method which forms thin-film transistors of the bottom gate type by inkjet technique.

[Patent Document 1]
Japanese Unexamined Patent publication No. 2004-349583

DISCLOSURE OF THE INVENTION

Problem to be Solved by the Invention

However, thin-film transistors formed by inkjet technique have inferior characteristics such as of the leakage current at times of gate OFF, ON/OFF current ratio and mobility, compared with those formed by sputtering or the like in a vacuum. These characteristics of the thin-film transistors are greatly influenced by a connection state of interfaces between semiconductor films and gate insulating films of the thin-film transistors. A characteristic degradation will occur when the interfaces between these are even slightly contaminated with organic contaminants, oxidized contaminants or the like. That is, the inkjet technique can carry out printing formation of the thin-film transistors only in the atmosphere, and cannot carry out printing formation in a vacuum. Consequently, the thin-film transistors formed by inkjet technique are inevitably inferior in characteristics to those formed in a vacuum.

This invention has been made having regard to the state of the art noted above, and its object is to provide a method of manufacturing an optical matrix device having thin-film transistors of excellent characteristics, though its substrate has a large area.

Means for Solving the Problem

To fulfill the above object, this invention provides the following construction.

In a method of manufacturing an optical matrix device constructed with elements relating to light, having thin-film transistors, and arranged in a two-dimensional matrix form on a substrate, the method of this invention comprises a semiconductor film forming step for laminating semiconductor films on a transfer mold in a vacuum; a gate insulating film forming step for laminating gate insulating films continuously, in the vacuum, on the transfer mold having the semiconductor films laminated thereon; and a transfer step for transferring the gate insulating films and the semiconductor films onto first wires formed on the substrate beforehand.

According to the method of manufacturing an optical matrix device of this invention, the semiconductor films and gate insulating films which influence the characteristics of thin-film transistors most are formed continuously in a vacuum, whereby the interfaces between the semiconductor films and gate insulating films are not contaminated. Further, the semiconductor films and gate insulating films are formed in a vacuum, but wires need not be formed in a vacuum. Thus, the semiconductor films and gate insulating films formed in a vacuum are transferred onto the wires formed beforehand. Even if the substrate has a large area, the wires, semiconductor films and gate insulating films of the thin-film transistors can be formed efficiently. The optical matrix device also with excellent characteristics of the thin-film transistors can be manufactured.

When the wires are formed by inkjet technique, grooves of a pattern of the wires are formed, by imprint technique, in an insulating film on the substrate where the wires are to be formed, whereby droplets ejected by inkjet technique will extend along the pattern of the grooves. Consequently, even with the inkjet technique, the wires can be formed with high accuracy since spreading of the droplets can be prevented.

An insulating film may be formed on the wires to which the gate insulating films and semiconductor films have been transferred, and grooves of a pattern may be formed in this insulating film for further wires to be formed on the surface of this insulating film. Then, the wires can be formed with high accuracy.

The semiconductor films may be laminated directly on the transfer mold when the transfer mold has low adherence. However, when the transfer mold has high adherence and the laminated semiconductor films cannot be separated therefrom, a release layer may be formed on the transfer mold beforehand. If a material having adherence reducible by heating or UV radiation is employed as the release layer formed on the transfer mold beforehand, the gate insulating films and semiconductor films can be efficiently transferred onto the wires by heating or UV irradiation of the release layer. Further, if the first insulating film is an organic substance, it will be easy to carry out coating formation at normal temperature.

The gate insulating films may be formed on the transfer mold first, and the semiconductor films formed thereafter. Then, the semiconductor films can also be formed on the substrate side.

If the semiconductor films are an oxide semiconductor, thin-film transistors with excellent characteristics can be formed. Preferably, the gate insulating films are an inorganic substance since they are formed in a vacuum. Further, the transfer of the gate insulating films and semiconductor films, instead of transferring the substrate as a whole, may be carried out by dividing the substrate into small areas and repeating the transfer a number of times.

The above method of manufacturing the optical matrix device can manufacture a photodetector, radiation detector or image display device with stable characteristics of the thin-film transistors.

One other method of manufacturing an optical matrix device of this invention is a method of manufacturing an optical matrix device constructed with elements relating to light, having thin-film transistors, and arranged in a two-dimensional matrix form on a substrate, the method comprising a gate insulating film forming step for laminating gate insulating films on a transfer mold in a vacuum; a semiconductor film forming step for laminating semiconductor films continuously, in the vacuum, on the transfer mold having the gate insulating films laminated thereon; a first transfer step for transferring the gate insulating films and the semiconductor films to a film; and a second transfer step for transferring the gate insulating films and the semiconductor films transferred to the film, onto first wires formed beforehand on the substrate.

According to the one other method of manufacturing an optical matrix device of this invention, the gate insulating films and semiconductor films which influence the characteristics of thin-film transistors most are formed continuously in a vacuum, whereby the interfaces between the gate insulating films and semiconductor films are not contaminated. Further, the gate insulating films and semiconductor films are formed in a vacuum, but wires need not be formed in a vacuum. Thus, the gate insulating films and semiconductor films formed in a vacuum are transferred onto the wires formed beforehand. Even if the substrate has a large area, the wires, semiconductor films and gate insulating films of the thin-film transistors can be formed efficiently. The optical matrix device also with excellent characteristics of the thin-film transistors can be manufactured.

Further, with the first transfer step for transferring the gate insulating films and the semiconductor films laminated on the transfer mold to the film, and the second transfer step for transferring the gate insulating films and the semiconductor films transferred to the film, onto first wires formed beforehand on the substrate, any omission in transferring the gate insulating films and semiconductor films can be prevented to improve the yield of transfer.

The film has adherence reducible by heating or UV irradiation, and the second transfer step is executed with the adherence of the film reduced by heating or UV irradiation. Therefore, the gate insulating films and semiconductor films can be transferred conveniently from the film onto the first wires.

Effects of the Invention

The method of manufacturing an optical matrix device, according to this invention, can provide a method of manufacturing an optical matrix device having excellent characteristics of thin-film transistors although the active matrix substrate has a large area.

DESCRIPTION OF REFERENCES

Figure 1:
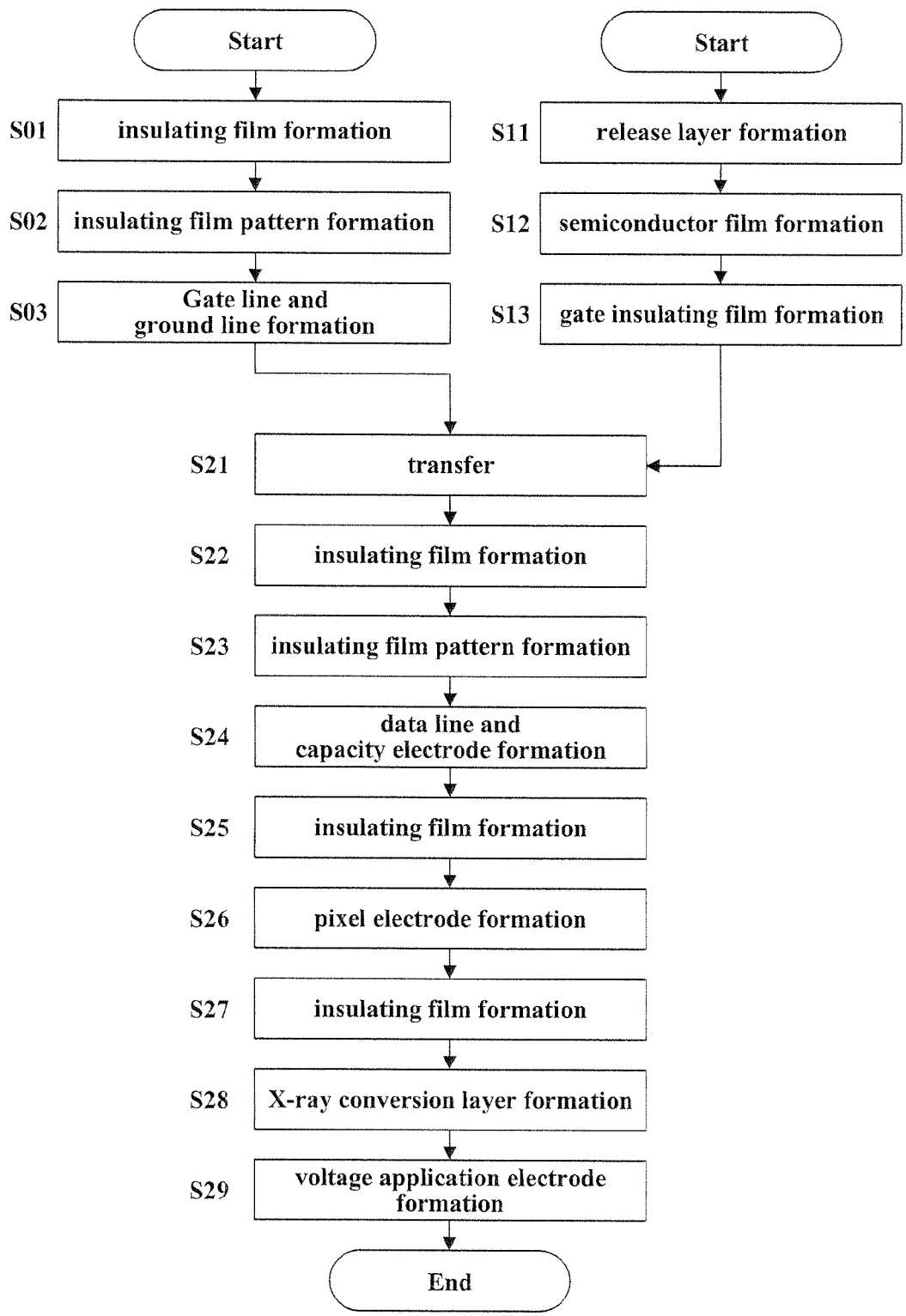
FIG. 1 is a flow chart showing a flow of a process of manufacturing a flat panel X-ray detector (FPD) according to Embodiment 1.

1 ... substrate
2 ... insulating film
3 ... gate lines
4 ... ground lines
5 ... transfer mold
6 ... transfer mold
7 ... release layer
8 ... semiconductor films
9 ... gate insulating films
10 ... insulating film
11 ... data lines
12 ... capacity electrodes
15 ... thin-film transistors (TFTs)
27 ... flat panel X-ray detector (FPD)
50 ... adhesive films
52 ... film
DU ... X-ray detecting elements

[Embodiment 1]

<Flat Panel X-ray Detector Manufacturing Method>

A method of manufacturing a flat panel X-ray detector (hereinafter called FPD) as an example of optical matrix devices of this invention will be described hereinafter with reference to the drawings.

Figure 11:
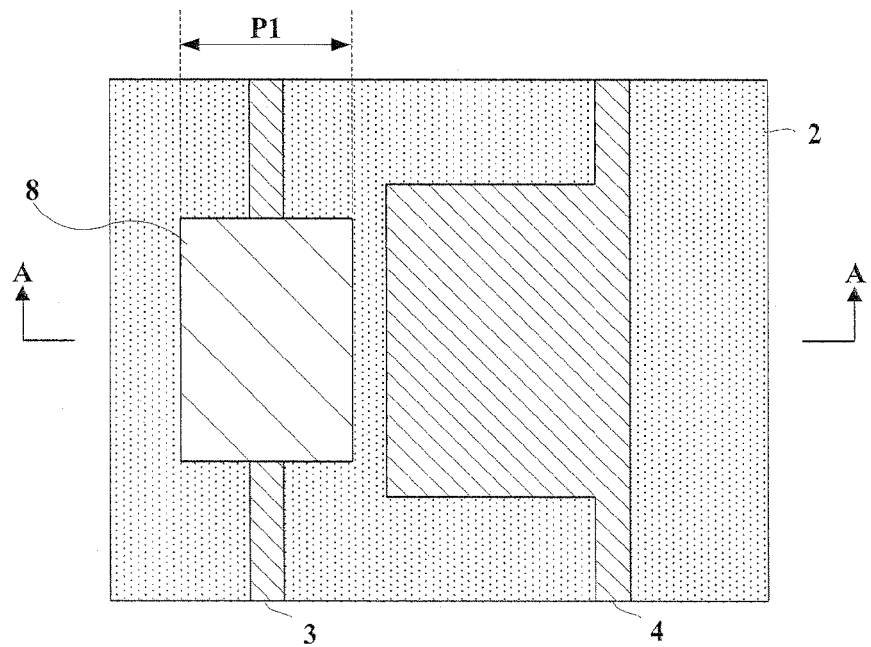
FIG. 11 is a front view showing the process of manufacturing the FPD according to Embodiment 1.
Figure 12:
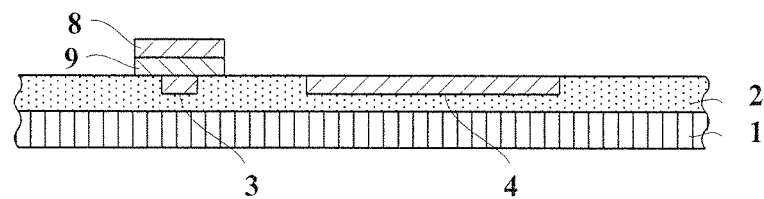
FIG. 12 is a view in vertical section showing the process of manufacturing the FPD according to Embodiment 1.

FIG. 1 is a flow chart showing a flow of a process of manufacturing the FPD according to Embodiment 1. FIGS. 2 through 22 are views showing the process of manufacturing the FPD according to Embodiment 1. FIG. 12 is a section taken on line A-A of FIG. 11. FIG. 14 is a section taken on line A-A of FIG. 13. FIG. 17 is a section taken on line A-A of FIG. 16.

The process of manufacturing the FPD in Embodiment 1 is divided roughly into two processes. Referring to FIG. 1, one is a process (steps S01-S03 and steps S21-S29) of forming an active matrix substrate and a radiation conversion layer on a substrate, and the other is a process (Steps S11-S13) of forming semiconductor films and gate insulating films of thin-film transistors (hereinafter called TFTs).

(Step S01) Insulating Film Formation

Figure 2:
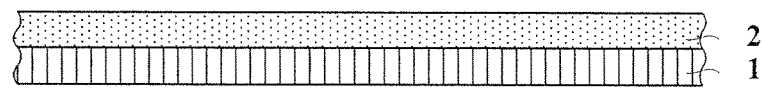
FIG. 2 is a view in vertical section showing the process of manufacturing the FPD according to Embodiment 1.

As shown in FIG. 2, an insulating film 2 is formed on a surface of a substrate 1. The substrate 1 may be any one of glass, a synthetic resin and a metal. In the case of the synthetic resin, while polyimide, PEN (polyethylenenaphthalate), PES (polyether sulfone) and PET (polyethylene terephthalate) are cited as examples, what is preferred is polyimide which is excellent in heat resistance. When a metal such as stainless steel is employed, the substrate 1 can be used also as ground line to be described hereinafter. If the substrate 1 and insulating film 2 are an organic substance such as a synthetic resin, a flexible substrate can be manufactured. This provides an advantage that the substrate does not break even when dropped. If the substrate is flexible, mass production can be made by roll-to-roll. If the insulating film 2 is an organic substance, it will be easy to carry out coating formation at normal temperature.

The insulating film 2, preferably, is formed of an organic material which is thermoplastic or light-curable, and polyimide, acrylic resin and UV-curable resin may be cited. This insulating film 2 is formed uniformly on a surface of the substrate 1. The insulating film 2 corresponds to the first insulating film in this invention. Step S01 corresponds to the first insulating film forming step in this invention.

(Step S02) Insulating Film Pattern Formation

Figure 3:
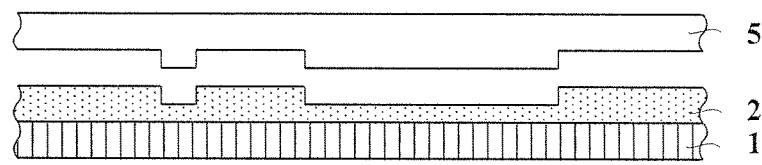
FIG. 3 is a view in vertical section showing the process of manufacturing the FPD according to Embodiment 1.
Figure 4:
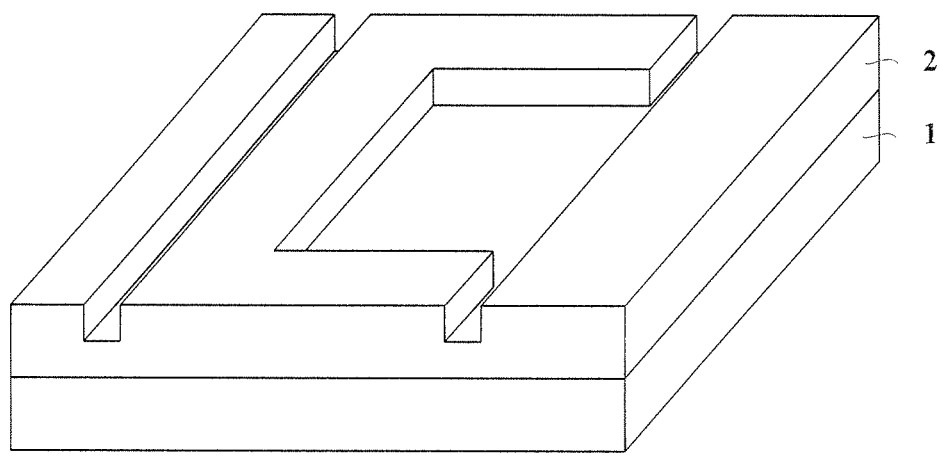
FIG. 4 is an outline perspective view showing the process of manufacturing the FPD according to Embodiment 1.
Figure 5:
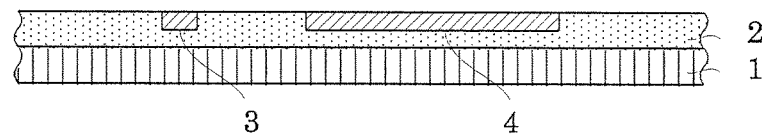
FIG. 5 is a view in vertical section showing the process of manufacturing the FPD according to Embodiment 1.

As shown in FIG. 3, a transfer mold 5 having, formed beforehand, patterns of gate lines 3 and ground lines 4 to be formed in a subsequent step is pressed on the insulating film 2 in a softened state formed on the substrate 1. If the insulating film 2 is thermoplastic at this time, the transfer mold 5 is pressed on the insulating film 2 heated beforehand and maintained in the softened state. After the patterns of the transfer mold 5 are transferred onto the insulating film 2, the insulating film 2 is cooled to harden the insulating film 2, and the transfer mold 5 is released from the insulating film 2. Consequently, as shown in FIG. 4, grooves providing the patterns of gate lines 3 and ground lines 4 to be formed in the subsequent step are formed in the insulating film 2. If the insulating film 2 is UV-curable, the insulating film 2 is irradiated with ultraviolet light after pressing the transfer mold 5 on the insulating film 2 in the softened state. This ultraviolet irradiation will harden the insulating film 2 to form the patterns in the insulating film 2. The transfer mold 5 employed may be formed of Si (silicon), Ni (nickel) or PDMS (Polydimethylsiloxane), for example. The patterns may be formed on the transfer mold 5 by EB exposure or photolithography. Step S02 corresponds to the first pattern forming step in this invention.

(Step S03) Gate Line and Ground Line Formation

The gate lines 3 and ground lines 4 are formed, by inkjet technique, on the insulating film 2 with the patterns formed therein. Since the grooves are formed in the patterns for forming the gate lines 3 and ground lines 4 on the insulating film 2, metal ink ejected by inkjet technique is extended in the patterns of the grooves. The gate lines 3 correspond to the first wires in this invention. Step S03 corresponds to the first wire forming step in this invention.

Next, formation of the semiconductor films and gate insulating films will be described, these being formed through a process separate from by the above steps S01-S03. In order to form the gate insulating films and semiconductor films (gate channels) on the gate lines 3 formed in the above step S03, these are transferred using a transfer technique with application of imprinting technique.

(Step S11) Release Layer Formation

Figure 6:
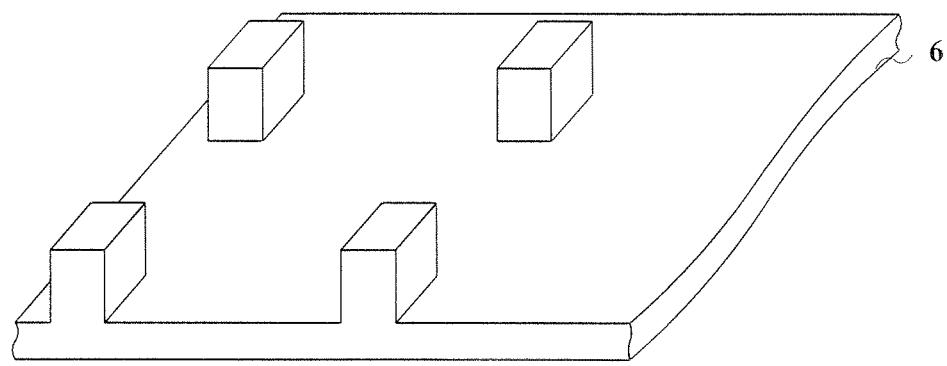
FIG. 6 is an outline perspective view of a transfer mold used in the process of manufacturing the FPD according to Embodiment 1.
Figure 7:
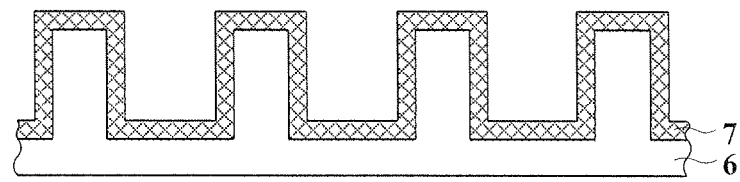
FIG. 7 is a view in vertical section showing the process of manufacturing the FPD according to Embodiment 1.

As shown in FIGS. 6 and 7, a release layer 7 is coated and formed over an entire surface of a transfer mold 6 having a shape of grooves and ridges formed beforehand in predetermined positions of a pattern for forming the semiconductor films (gate channels). The release layer 7 preferably is, for example, a resin whose adherence lowers when heated to about 80° C., or a resin whose adherence lowers when irradiated with ultraviolet light. Cited as resins whose adherence lowers when heated to about 80° C. are a self-releasing paste (adhesive for temporary fixation) manufactured by Sekisui Chemical Co., Ltd., and UV-curable hot melt temporary adhesive A-1579 manufactured by Kabushiki Kaisha Tesco.

Depending on circumstances, only a monomolecular layer may be coated thin by fluorine plasma treatment, for example. A pitch of the grooves and ridges of this release layer 7 corresponds to pitch intervals of the semiconductor films (gate channels) of the TFTs. The transfer mold 6 formed of Si, $SiO_2$ (silicon oxide), SiC (silicon carbide), nickel or PDMS, for example, can be employed.

(Step S12) Semiconductor Film Formation

Figure 8:
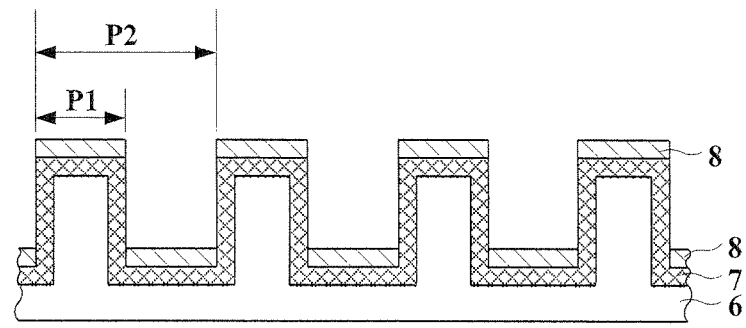
FIG. 8 is a view in vertical section showing the process of manufacturing the FPD according to Embodiment 1.

As shown in FIG. 8, semiconductor films 8 are formed in a vacuum on the transfer mold 6 with the release layer 7 formed thereon. The degree of vacuum, preferably, is about 1 Pa or less. Alternatively, a decompressed atmosphere of about 1 Pa or less may be produced by separately supplying a gas such as of Ar (argon), $O_2$ (oxygen) or $N_2$ (nitrogen) after vacuuming to 0.1 Pa or less. The formation technique may be sputtering, plasma vacuum deposition or ion blading. A material for the semiconductor films 8 may be an oxide semiconductor such as $InGaZnO_4$ (gallium indium zinc oxide) or ZnO (zinc oxide), or the chalcogenide type such as CdS (cadmium sulfide), for example. Besides these, it may be Si, a-Si (amorphous silicon) or poly-Si (polysilicon), or may be an organic semiconductor film consisting of an organic substance such as pentacene. When oxide semiconductor film which is an inorganic substance is employed, mobility is high, and stability with the passage of time is good compared with organic semiconductor film. In FIG. 8, width P1 of the semiconductor films 8 formed through the release layer 7 on the surfaces of the ridges of the transfer mold 6 is about 1-20 μm. Pitch P2 of the grooves and ridges of the transfer mold 6 with the release layer 7 laminated thereon is about 50-200 μm, since it is comparable to the pitch of one pixel of an active matrix substrate 17 to be formed subsequently. Step S12 corresponds to the semiconductor film forming step in this invention.

(Step S13) Gate Insulating Films

Figure 9:
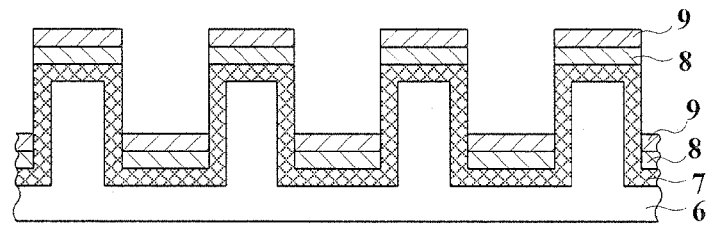
FIG. 9 is a view in vertical section showing the process of manufacturing the FPD according to Embodiment 1.

As shown in FIG. 9, gate insulating films 9 are formed in a vacuum on the transfer mold 6 with the semiconductor films 8 formed thereon. The degree of vacuum, preferably, is about 1 Pa or less. Alternatively, a decompressed atmosphere of about 1 Pa or less may be produced by separately supplying a gas such as of Ar, $O_2$ or $N_2$ after vacuuming to 0.1 Pa or less. The formation technique may be sputtering, plasma vacuum deposition or ion blading. A material for the gate insulating films 9 may be an inorganic oxide such as $SiO_2$, $SiN_x$ (silicon nitride), $ZrO_2$ (zirconium oxide), $Y_2O_3$ (yttrium oxide), $Al_2O_3$ (aluminum oxide) or $TiO_2$ (titanium oxide), for example. Ferroelectric thin film also is employable as a gate insulating film material. Further, an organic substance such as polyimide, acrylic or PVP (polyvinylpyrrolidone) may also be used. Step S13 corresponds to the gate insulating film forming step in this invention.

(Step S21) Transfer

Figure 10:
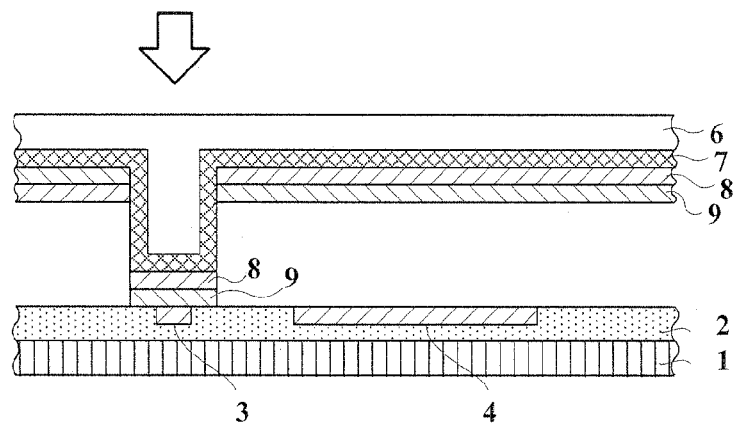
FIG. 10 is a view in vertical section showing the process of manufacturing the FPD according to Embodiment 1.

Next, as shown in FIG. 10, the semiconductor films 8 and gate insulating films 9 are transferred by pressing, on the gate lines 3, the transfer mold 6 with the semiconductor films 8 and gate insulating films 9 laminated thereon, and releasing the release layer 7. Consequently, as shown in FIGS. 11 and 12, the gate insulating films 9 are formed on the gate lines 3, and further thereon, the semiconductor films 8 are formed. Releasing of the release layer 7 may be done by heat, by ultraviolet irradiation, by ultrasonic vibration, or by combination thereof. Where the release layer 7 has adherence which lowers when heated to 80° C. or more, the adherence of the release layer 7 will be lowered by heating the transfer mold 6 to 80° C. or more. Then, by applying ultrasonic vibration to the transfer mold 6, the semiconductor films 8 and gate insulating films 9 can be released from the transfer mold 6. Step S21 corresponds to the transfer step in this invention.

(Step S22) Insulating Film Formation

Figure 13:
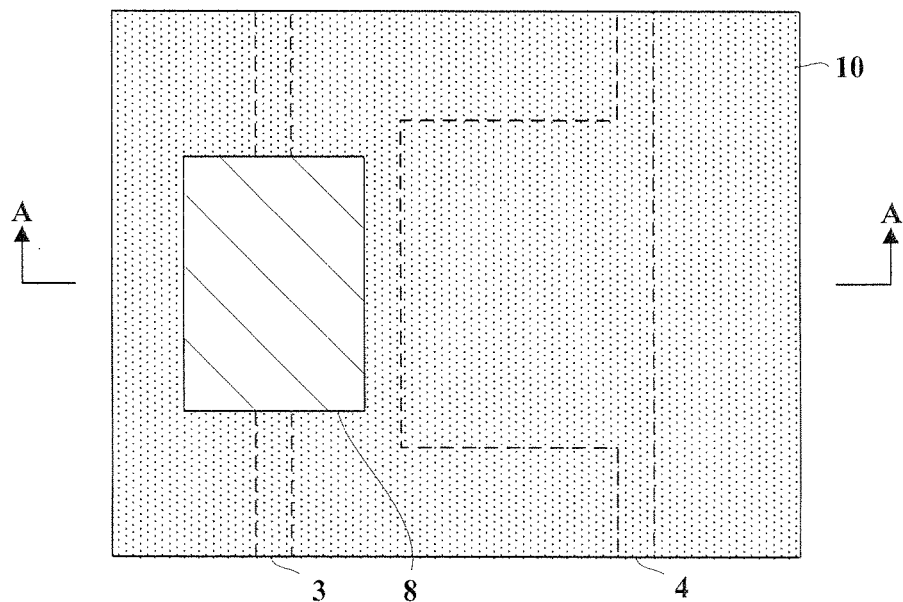
FIG. 13 is a front view showing the process of manufacturing the FPD according to Embodiment 1.
Figure 14:
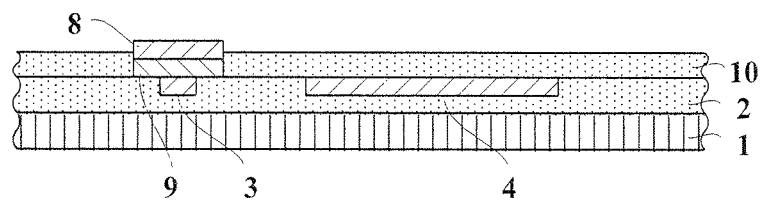
FIG. 14 is a view in vertical section showing the process of manufacturing the FPD according to Embodiment 1.

Next, as shown in FIGS. 13 and 14, an insulating film 10 is formed on the ground lines 4 and insulating film 2. The insulating film 10 is not laminated on upper surfaces of the semiconductor films 8 since they are connected to data lines and capacity electrodes in a subsequent step. The insulating film 10, preferably, is also formed of an organic material which is thermoplastic or light-curable, and polyimide, acrylic resin and UV-curable resin may be cited. The insulating film 10 corresponds to the second insulating film in this invention. Step S22 corresponds to the second insulating film forming step in this invention.

(Step S23) Insulating Film Pattern Formation

Figure 15:
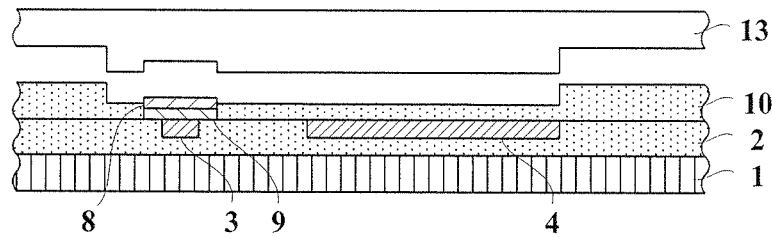
FIG. 15 is a view in vertical section showing the process of manufacturing the FPD according to Embodiment 1.

Next, as shown in FIG. 15, a transfer mold 13, which has, formed beforehand, patterns of the data lines 11 and capacity electrodes 12 to be formed on the insulating film 10 in a softened state in the subsequent step, is pressed on the insulating film 2. The method of pattern formation on the insulating film 10 is the same as that of step S02, and will not be described. Consequently, grooves which are the patterns of the data lines 11 and capacity electrodes 12 to be formed in the subsequent step are formed in the insulating film 10. Step S23 corresponds to the second pattern forming step in this invention.

(Step S24) Data Line and Capacity Electrode Formation

Figure 16:
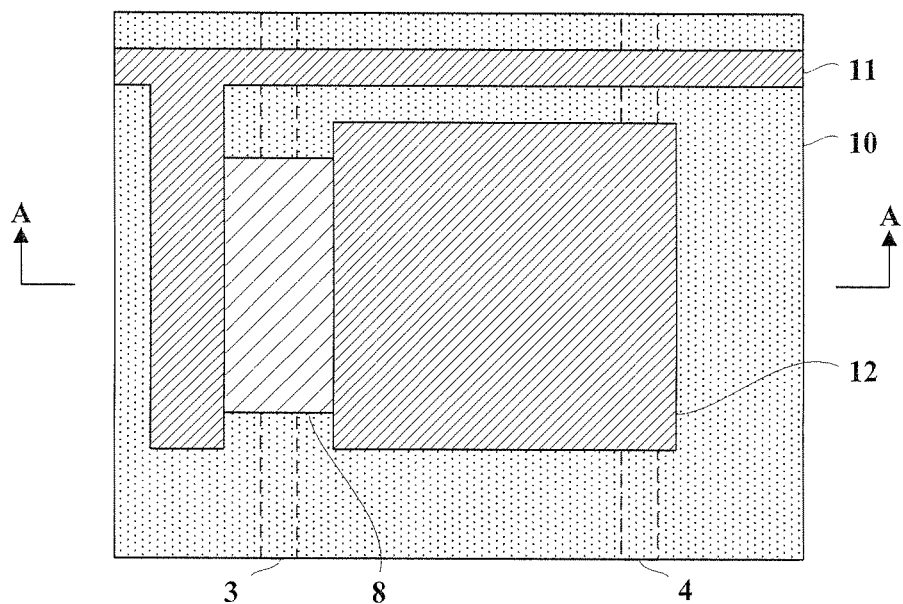
FIG. 16 is a front view showing the process of manufacturing the FPD according to Embodiment 1.
Figure 17:
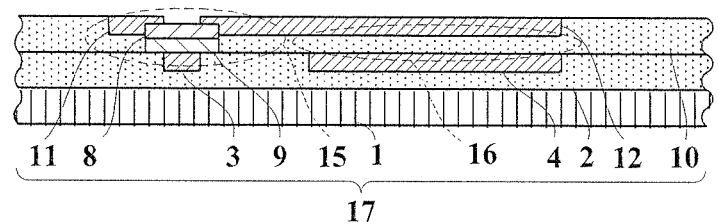
FIG. 17 is a view in vertical section showing the process of manufacturing the FPD according to Embodiment 1.

As shown in FIGS. 16 and 17, the capacity electrodes 12 and data lines 11 are formed on the insulating film 10 as opposed to each other across the semiconductor films 8. The capacity electrodes 12 are laminated and formed to be opposed to the ground lines 4 across the insulating film 10. Part of the gate lines 3 opposed to the semiconductor films 8, part of the data lines 11 adjacent the semiconductor films 8, the semiconductor films 8, part of the capacity electrodes 12 adjacent the semiconductor films 8, and the insulating films 9 interposed between the gate lines 3 and the data lines 11, semiconductor films 8 and capacity electrodes 12, constitute TFTs 15. The capacity electrodes 12, ground lines 4, and insulating film 10 interposed between the capacity electrodes 12 and ground lines 4, constitute capacitors 16. Thus, the substrate 1, capacity electrodes 12, capacitors 16, TFTs 15, semiconductor films 8, data lines 11, gate lines 3, ground lines 4, insulating film 2, gate insulating films 9, and insulating film 10, constitute the active matrix substrate 17. The data lines 11 correspond to the second wires in this invention. Step S24 corresponds to the second wire forming step in this invention.

(Step S25) Insulating Film Formation

Figure 18:
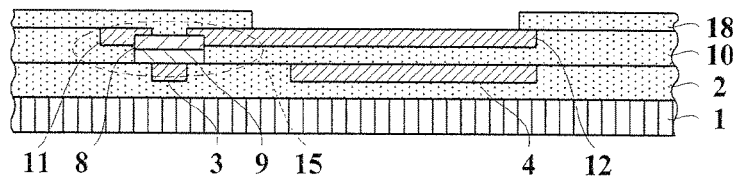
FIG. 18 is a view in vertical section showing the process of manufacturing the FPD according to Embodiment 1.

As shown in FIG. 18, an insulating film 18 is laminated and formed on the data lines 11, capacity electrodes 12, semiconductor films 8 and insulating film 10. In order to connect to pixel electrodes 19 to be laminated subsequently, the insulating film 18 is not laminated and formed on part of the capacity electrodes 12, but the insulating film 18 is laminated and formed around the capacity electrodes 12. The insulating film 18 functions also as passivation film of the TFTs 15.

(Step S26) Pixel Electrode Formation

Figure 19:
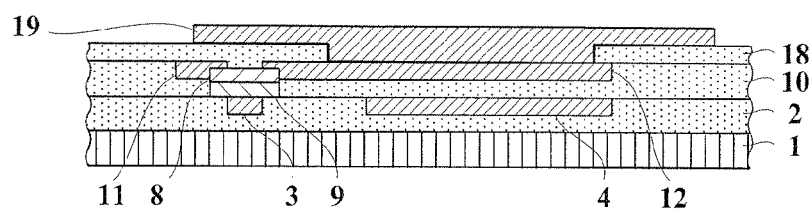
FIG. 19 is a view in vertical section showing the process of manufacturing the FPD according to Embodiment 1.

As shown in FIG. 19, the pixel electrodes 19 are laminated on the capacity electrodes 12 and insulating film 18. This electrically connects the pixel electrodes 19 and capacity electrodes 12.

(Step S27) Insulating Film Formation

Figure 20:
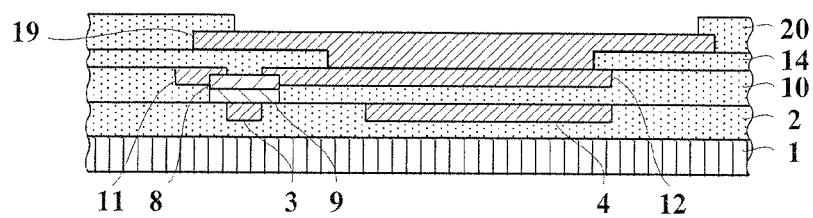
FIG. 20 is a view in vertical section showing the process of manufacturing the FPD according to Embodiment 1.

As shown in FIG. 20, an insulating film 20 is laminated on the pixel electrodes 19 and insulating film 18. In order for the pixel electrodes 19 to collect carriers generated by an X-ray conversion layer 21 to be laminated subsequently, the insulating film 20 is not laminated and formed on large parts of the pixel electrodes 19 to secure direct contact with the X-ray conversion layer 21, but the insulating film 20 is laminated and formed only around the pixel electrodes 19. That is, the insulating film 20 is laminated and formed so as to leave open large parts of the pixel electrodes 19.

(Step S28) X-Ray Conversion Layer Formation

Figure 21:
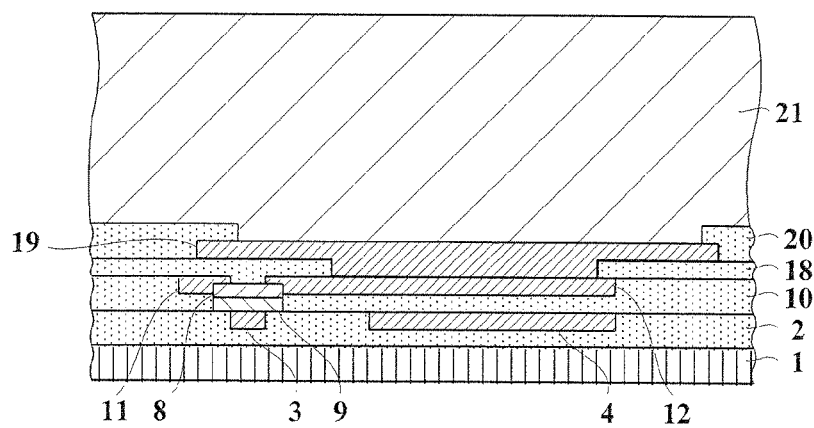
FIG. 21 is a view in vertical section showing the process of manufacturing the FPD according to Embodiment 1.

As shown in FIG. 21, the X-ray conversion layer 21 is laminated and formed on the pixel electrodes 19 and insulating film 20. In the case of Embodiment 1, vacuum deposition is used since amorphous selenium (a-Se) is laminated as the X-ray conversion layer 21 which is a light receiving element. The laminating method may be changed according to the type of semiconductor used for the X-ray conversion layer 21.

(Step S29) Voltage Application Electrode Formation

Figure 22:
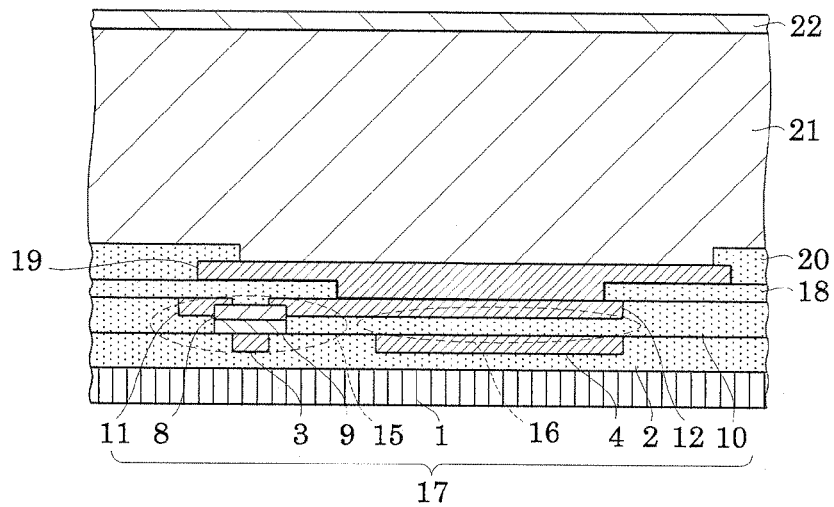
FIG. 22 is a view in vertical section showing the process of manufacturing the FPD according to Embodiment 1.
Figure 23:
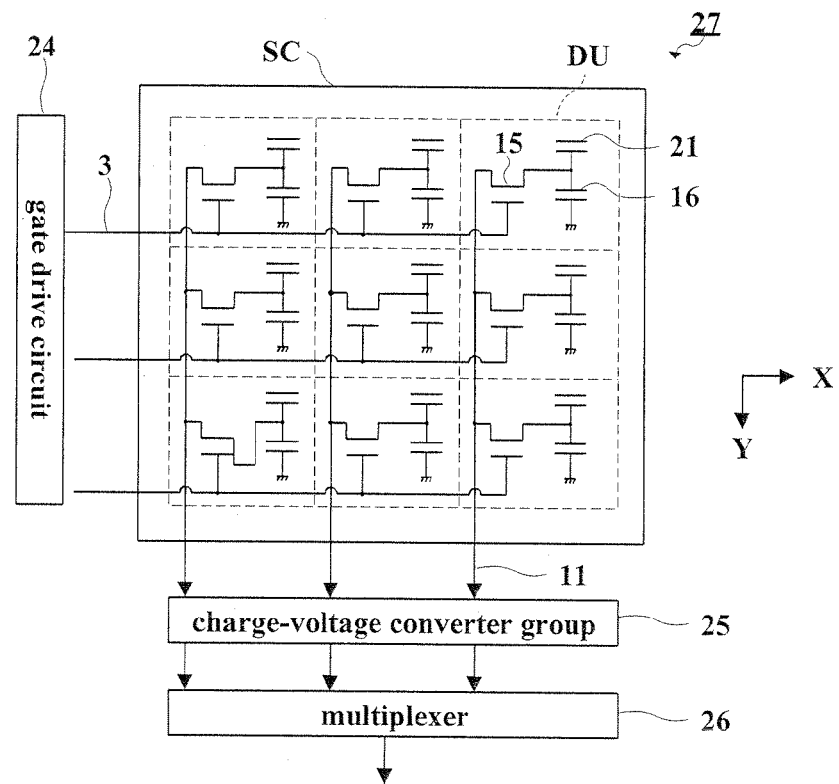
FIG. 23 is a circuit diagram showing a construction of an active matrix substrate and adjacent circuits provided for the FPD according to Embodiment 1.

As shown in FIG. 22, a voltage application electrode 22 is laminated and formed on the X-ray conversion layer 21. Subsequently, as shown in FIG. 23, peripheral circuits such as a gate drive circuit 24, a charge-voltage converter group 25 and a multiplexer 26 are connected to complete a manufacturing series of the FPD 27.

As a method of forming these insulating films 2, 10, 18 and 20 of the FPD 27, an inkjet method is preferred in the case of local formation, and a spin coat method is preferred in the case of uniform formation over the entire substrate. In addition to this, they may be formed by letterpress, gravure printing, flexography and so on.

As a method of transferring the semiconductor films 8 and gate insulating films 9, the substrate 1 may be transferred as a whole, or may be divided into small areas to be transferred repeatedly. As pattern formation on the insulating film 2 and insulating film 10 also, the patterns may be formed on the substrate 1 as a whole, or the patterns may be formed repeatedly on small divided areas.

<Flat Panel X-Ray Detector>

As shown in FIGS. 22 and 23, the FPD 27 manufactured as described above includes an X-ray detecting unit SC which receives X-rays and has X-ray detecting elements DU arranged in XY directions, in a two-dimensional matrix form. The X-ray detecting elements DU are operable in response to incident X-rays, and output charge signals on a pixel-by-pixel basis. For convenience of description, FIG. 23 shows the X-ray detecting elements DU in a two-dimensional matrix arrangement for 3×3 pixels. In the actual X-ray detecting unit SC, the X-ray detecting elements DU are in a matrix arrangement for 4096×4096 pixels, for example, to match the number of pixels of the FPD 27. The X-ray detecting elements DU correspond to the elements relating to light in this invention.

As shown in FIG. 22, the X-ray detecting elements DU have, formed under the voltage application electrode 22 to which a bias voltage is applied, the X-ray conversion layer 21 which generates carriers (electron-hole pairs) in response to incident X-rays. And the pixel electrodes 19 are formed under the X-ray conversion layer 21 for collecting the carriers on a pixel-by-pixel basis. Further, the active matrix substrate 17 is formed, which includes the capacitors 16 for storing electric charges generated by the carriers collected by the pixel electrodes 19, the TFTs 15 electrically connected to the capacitors 16, the gate lines 3 for sending signals of switching action to the TFTs 15, the data lines 11 for reading the electric charges from the capacitors 16 through the TFTs 15 as X-ray detection signals, and the substrate 1 which supports these. With this active matrix substrate 17, X-ray detection signals can be read out, on a pixel-by-pixel basis, from the carriers generated in the X-ray conversion layer 21. Thus, the X-ray conversion layer 21, pixel electrodes 19, capacitors 16 and TFTs 15 are provided for the respective X-ray detecting elements DU.

The X-ray conversion layer 21 consists of an X-ray sensitive semiconductor, which is formed of non-crystalline, amorphous selenium (a-Se) film, for example. It has a construction (direct conversion type) which, when X-rays fall on the X-ray conversion layer 21, directly generates a given number of carriers proportional to the energy of these X-rays. Especially this a-Se film can easily provide an enlarged detection area. The X-ray conversion layer 21 may be a semiconductor film other than the above, such as a polycrystalline semiconductor film of CdTe (cadmium telluride), for example.

Thus, the FPD 27 in this embodiment is a flat panel X-ray sensor of two-dimensional array construction with the numerous detecting elements DU which are X-ray detection pixels arranged along the X- and Y-directions. Each detecting element DU can carry out local X-ray detection, which enables a two-dimensional distribution measurement of X-ray intensity.

X-ray detecting operation by the FPD 27 in this embodiment is as follows.

That is, when X-rays are emitted to a subject to carry out X-ray imaging, a radiological image transmitted through the subject is projected to the a-Se film, and carriers proportional to density variations of the image are generated in the a-Se film. The generated carriers are collected by the pixel electrodes 19 due to an electric field produced by the bias voltage. Electric charges corresponding to the number of carriers generated are induced by and stored for a predetermined time in the capacitors 16. Subsequently, a gate voltage sent through the gate lines 3 from the gate drive circuit 24 causes the TFTs 15 to take switching action. This outputs the charges stored in the capacitors 16 via the TFTs 15 and through the data lines 11 to be converted into voltage signals by the electric charge-voltage converter group 25, and read out in order as X-ray detection signals by the multiplexer 26.

An electric conductor which forms the data lines 11, gate lines 3, ground lines 4, pixel electrodes 19, capacity electrodes 12 and voltage application electrode 22 in the above FPD 27 may be printed and formed of metal ink produced by making a metal such as Ag, Au, Cu or the like into paste form. They may be formed by printing in an organic ink of high conductivity represented by ITO ink, or polyethylene dioxythiophene doped with polystyrene sulfonate (PEDOT/PSS). They may be formed of ITO and Au thin film, for example.

In foregoing Embodiment 1, the X-ray conversion layer 21 generates carriers in response to X-rays, but X-rays are not limitative. It is possible to use a radiation conversion layer sensitive to radiation such as gamma rays, or a light conversion layer sensitive to light. A photodiode may be used instead of the light conversion layer. Then, a radiation detector and a photodetector, although the same in structure, can be manufactured.

The method of manufacturing the optical matrix device constructed as described above continuously forms the semiconductor films 8 and gate insulating films 9 in a vacuum. Therefore, the interfaces between the semiconductor films 8 and gate insulating films 9 are never affected by contaminants such as organic contaminants or oxidized contaminants. Since traps at the interfaces between the semiconductor films 8 and gate insulating films 9 can be reduced, characteristics of TFTs 15 such as leak current value at times of gate OFF, ON/OFF current ratio and mobility have been improved, compared with TFTs formed by inkjet technique. Further, the semiconductor films 8 and gate insulating films 9 formed in a vacuum can be transferred onto the gate lines 3 easily by transferring them by a method with application of imprinting technique.

In the imprint technique, the shape of a transfer mold is transferred, with grooves and ridges inverted, to a resist layer by pressing the transfer mold on the resist film. In this invention, two functional films consisting of the semiconductor films 8 and gate insulating films 9 are laminated on the transfer mold 5 in a vacuum, and these are transferred to predetermined positions on the gate lines 3 in the normal atmosphere. Consequently, even if the transfer mold 5 has a small area, the semiconductor films 8 and gate insulating films 9 can be laminated one after another on the transfer mold 5 inside a vacuum chamber, and successively transferred to the predetermined positions on the gate lines 3. That is, even though the substrate 1 has a large area, the transfer mold 5 may be smaller than the substrate 1, which allows the vacuum chamber to have a reduced size.

Since the wire and electrode forming patterns are formed by imprint technique as grooves in the insulating film on which the wires such as the gate lines 3, ground lines 4 and data lines 11, and the capacity electrodes 12, are to be formed, the respective wires and electrodes can be formed easily by inkjet technique. That is, since droplets ejected by inkjet technique will extend along the pattern of the grooves formed in the insulating film, patterns accurate in line width and precise position can be formed even by inkjet technique.

[Embodiment 2]

Figure 24:
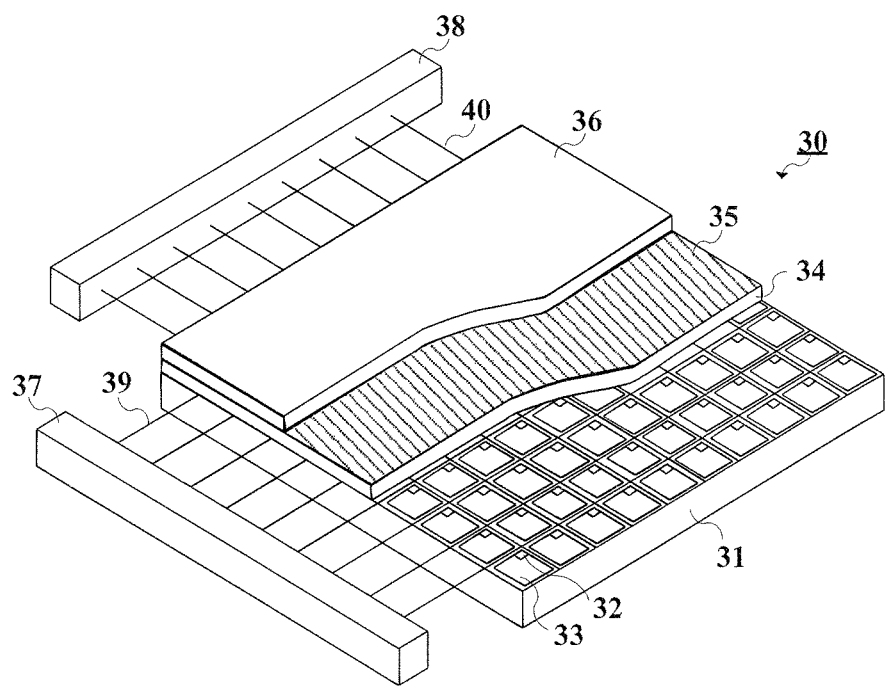
FIG. 24 is an outline perspective view showing an image display device having an active matrix substrate prepared by a method according to Embodiment 2.

Next, Embodiment 2 of this invention will be described with reference to FIG. 24. FIG. 24 is a partly broken away perspective view of a display (organic EL display) having an active matrix substrate, as an example of image display devices.

It is desirable that the method of this invention is applied also to manufacture of image display devices. As image display devices, a thin electroluminate display and a liquid crystal display can be cited. An image display device also has pixel circuits formed in the active matrix substrate, and application to such a device is desirable.

As shown in FIG. 24, an organic EL display having an active matrix substrate includes a substrate 31, an organic EL layer 34, a transparent electrode 35 and a protective film 36 successively laminated on the substrate 31 and connected to a plurality of TFT circuits 32 and pixel electrodes 33 arranged in a matrix form on the substrate 31, a plurality of source electrode lines 39 connecting each TFT circuit 32 to a source drive circuit 37, and a plurality of gate electrode lines 40 connecting each TFT circuit 32 to a gate drive circuit 38. Here, the organic EL layer 34 is formed by laminating respective layers such as an electron transport layer, a luminous layer and a hole transport layer.

Also in this organic EL display 30, the gate insulating films and semiconductor films in the TFT circuits 32 are formed by the method of manufacturing the optical matrix device in Embodiment 1 described hereinbefore, and thus no possibility of deterioration in the characteristics of the TFT circuits 32. Consequently, the image display device with quick response, although large in area, can be manufactured.

The above image display device is a display which uses display elements such as organic EL, but without being limited thereto, it may be a liquid crystal display having liquid crystal display elements. With the liquid crystal display, pixels are colored RGB by color filters. Further, where transparent wires and a transparent substrate are employed, there will be a merit of increasing light transmission efficiency. It may be a display having other display elements.

[Embodiment 3]

Figure 25:
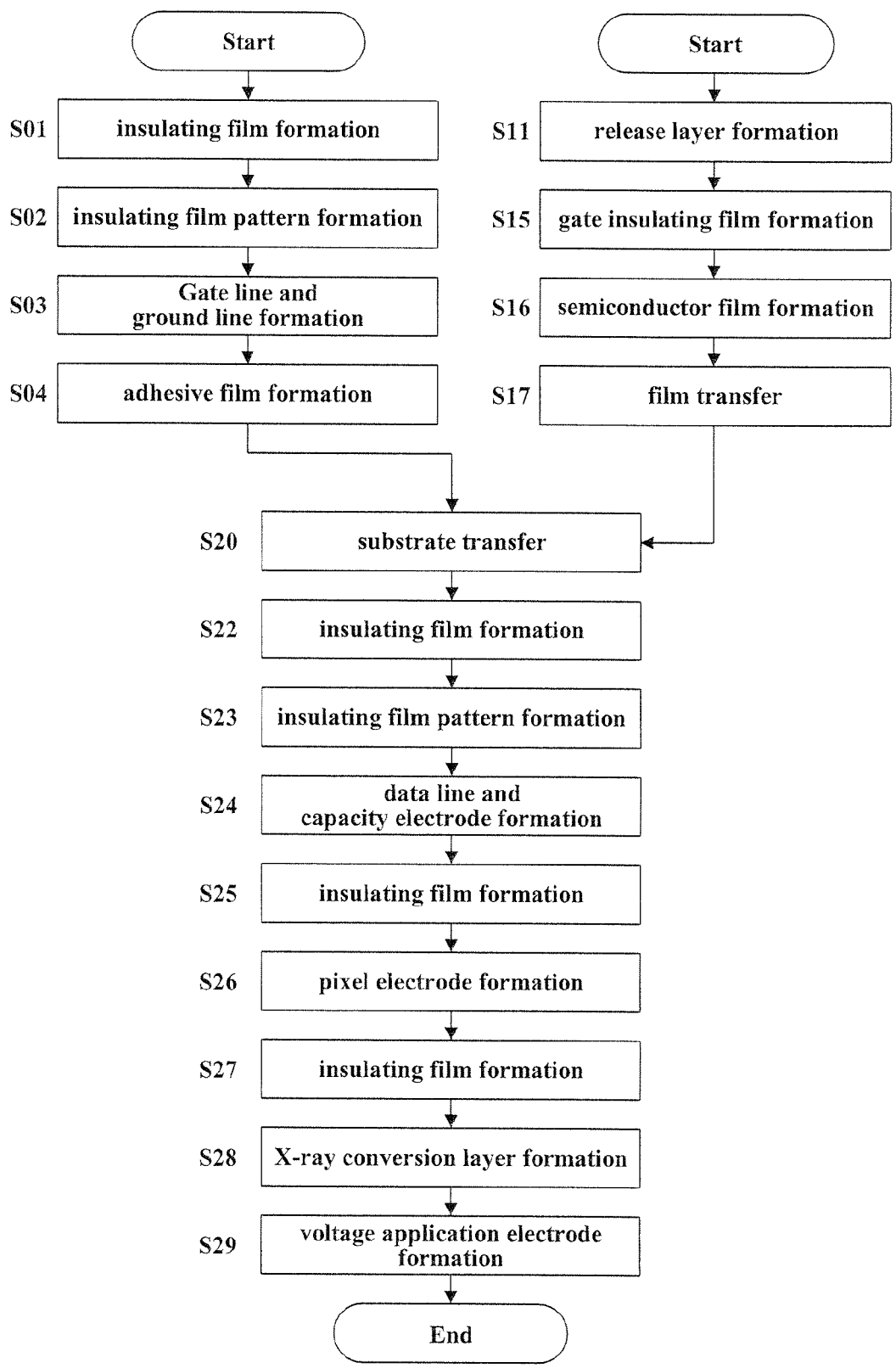
FIG. 25 is a flow chart showing a flow of a process of manufacturing a flat panel X-ray detector (FPD) according to Embodiment 3.

Next, Embodiment 3 of this invention will be described with reference to FIGS. 25-32. FIG. 25 is a flow chart showing a flow of an FPD manufacturing process according to Embodiment 3. FIGS. 26-32 are views showing the FPD manufacturing process.

Embodiment 3 relates to a change made in the transfer from the transfer mold to the substrate in Embodiment 1. That is, a characteristic of Embodiment 3 lies in that semiconductor films and insulating films formed on the transfer mold are once transferred onto a film, and thereafter further transferred onto the substrate. Another characteristic of Embodiment 3 lies in that adhesive films are formed in areas where the semiconductor films and insulating films are to be transferred onto the gate lines formed on the substrate. A method of manufacturing an optical matrix device different from Embodiment 1 will be described hereinafter. The rest of the method of manufacturing an optical matrix device is the same as the manufacturing method in Embodiment 1.

(Step S04) Adhesive Film Formation

Figure 26:
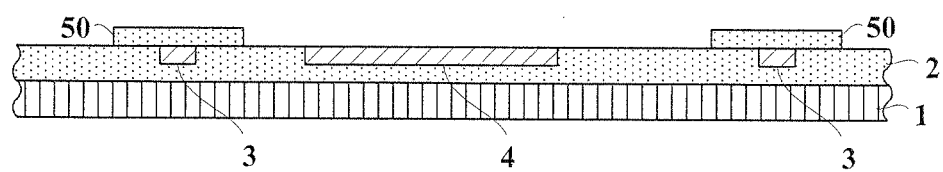
FIG. 26 is a view in vertical section showing the process of manufacturing the FPD according to Embodiment 3.

As shown in FIGS. 25 and 26, after steps S01-03 of Embodiment 1, adhesive films 50 are formed in positions on the gate lines 3 where the gate insulating films 9 and semiconductor films 8 are to be formed. The adhesive films 50 are locally applied using an ink-jet printer or dispenser. Instead of the local application, the adhesive films 50 may be formed by spin coating over entire surfaces on the insulating film 2, gate lines 3 and ground lines 4.

The adhesive films 50 are an adhesive insulator. The adhesive films 50, preferably, are polyimide or acrylic resin. The adhesive films, preferably, are heat-curable or curable by UV irradiation.

Next, formation of the semiconductor films and gate insulating films which are formed by a process separate from steps S01-S04 will be described. In Embodiment 3, as distinct from Embodiment 1, transfer is made from the transfer mold 6 to the substrate 1 through a film, and therefore the order of lamination of the semiconductor films and gate insulating films on the transfer mold 6 is reversed. The release layer formation of step S11 is the same as in Embodiment 1.

(Step S15) Gate Insulating Film Formation

Figure 27:
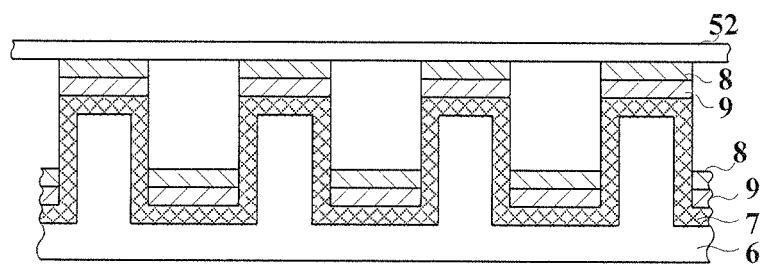
FIG. 27 is a view in vertical section showing the process of manufacturing the FPD according to Embodiment 3.
Figure 28:
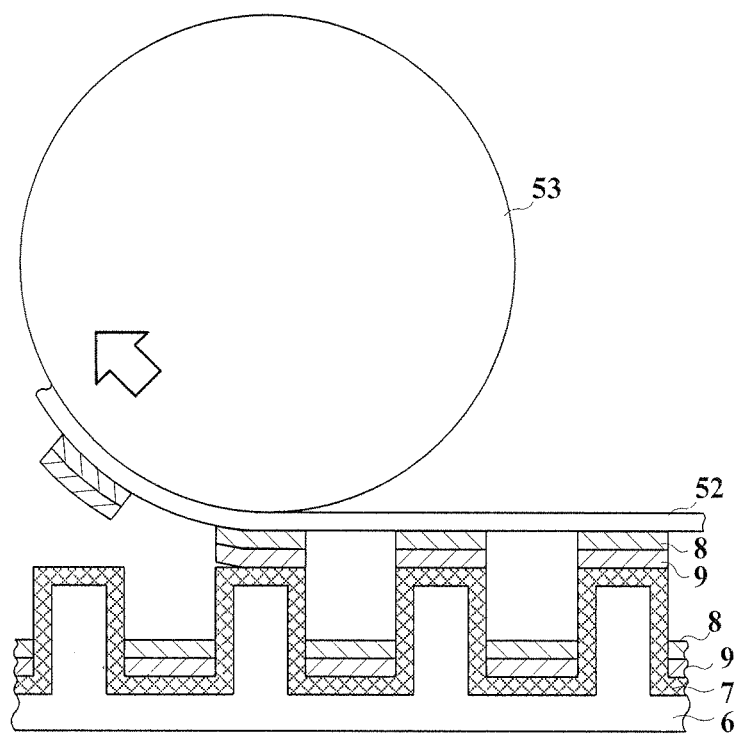
FIG. 28 is a view in vertical section showing the process of manufacturing the FPD according to Embodiment 3.

As shown in FIG. 27, gate insulating films 9 are formed, in a vacuum, on the transfer mold 6 with the release layer 7 formed thereon. The forming method is the same as in Embodiment 1.

(Step S16) Semiconductor Film Formation

As shown in FIG. 27, semiconductor films 8 are formed, continuously in the vacuum, without breaking the vacuum, on the transfer mold 6 with the gate insulating films 9 formed thereon. The forming method is the same as in Embodiment 1.

(Step S17) Film Transfer

As shown in FIG. 27, film 52 is uniformly applied to the semiconductor films 8 in the atmosphere. The film 52 has adherence, but has properties to lose the adherence by heating or UV irradiation. Where the release layer 7 loses adherence when heated, the film 52, preferably, loses adherence by UV irradiation. Where the release layer 7 loses adherence by UV irradiation, the film 52, preferably, loses adherence when heated. Where both the release layer 7 and film 52 lose adherence by heating, it is preferable that the release layer 7 loses adherence at low temperature more than the film 52 does. As an example of film which loses adherence when heated, REVALPHA manufactured by Nitto Denko Corporation is cited. As an example of film which loses adherence by UV irradiation, a UV separable dicing tape manufactured by Toyo Adtec Co., Ltd. is cited.

Figure 29:
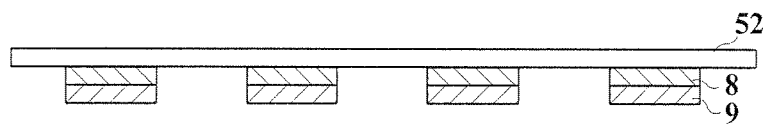
FIG. 29 is a view in vertical section showing the process of manufacturing the FPD according to Embodiment 3.

While the film 52 uniformly applied to the semiconductor films 8 with a roller, for example, is taken up by a roller 53, the semiconductor films 8 and gate insulating films 9 are transferred onto the film 52, with the adherence of the release layer 7 reduced by heating or UV irradiation, but with the adherence of the film 52 maintained. Since the transfer mold 6 and roller 53 move relative to each other and the adherence of the release layer 7 is reduced, the rotation of the roller 53 separates the semiconductor films 8 and gate insulating films 9 from the transfer mold 6 due to the adherence of film 52. The semiconductor films 8 and gate insulating films 9 are transferred gradually from an end of the transfer mold 6 onto the film 52, which leaves no remainder on the transfer mold 6. As shown in FIG. 29, the semiconductor films 8 and gate insulating films 9 are transferred onto the film 52. Step S17 corresponds to the first transfer step in this invention.

(Step S20) Substrate Transfer

Figure 30:
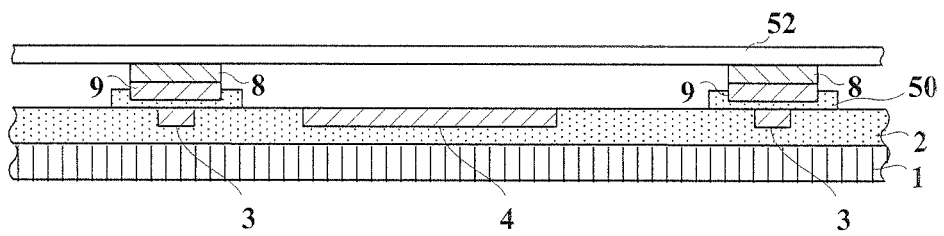
FIG. 30 is a view in vertical section showing the process of manufacturing the FPD according to Embodiment 3.

Next, as shown in FIG. 30, the film 52 is pressed so that the gate insulating films 9 may be formed on the adhesive films 50 of the substrate 1. The film 52 may be pressed with a roller or may be pressed with a plate press. Heating or UV irradiation is carried out in order to reduce the adherence of the film 52. It is preferred that, where the adherence of the film 52 is reduced by heating, the adhesive films 50 harden when heated. It is preferred that, where the adherence of the film 52 is reduced by UV irradiation, the adhesive films 50 harden when UV-irradiated. Consequently, reducing the adherence of the film 52 and hardening the adhesive films 50 can be effected simultaneously. The gate insulating films 9 may be laminated on the adhesive films 50, the gate insulating films 9 may be embedded in the adhesive films 50, or the gate insulating films 9 may be laminated directly on the gate lines 3. The adhesive films 50 function also as gate insulating films.

Figure 31:
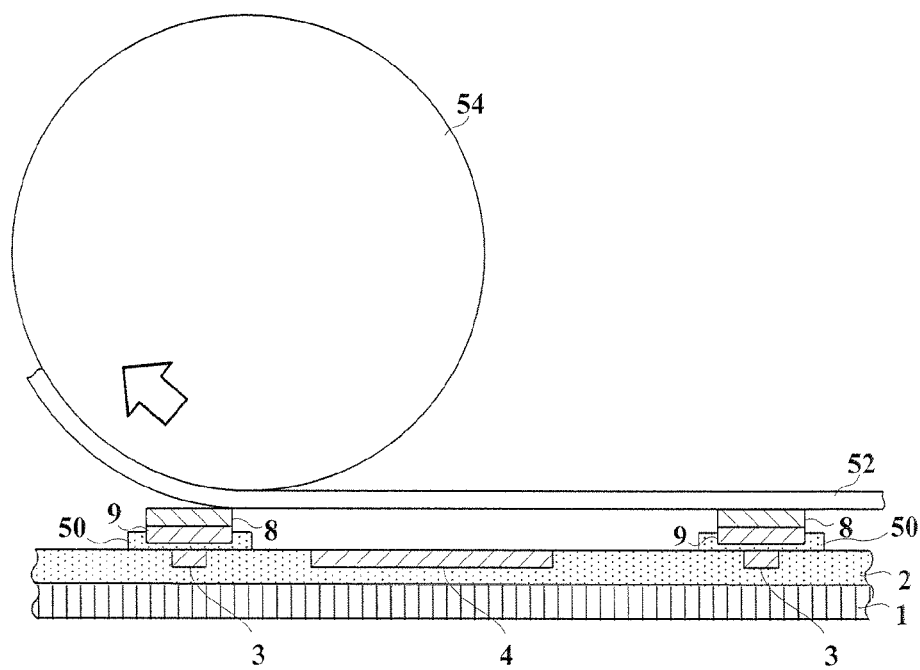
FIG. 31 is a view in vertical section showing the process of manufacturing the FPD according to Embodiment 3.

After forming the gate insulating films 9 and semiconductor films 8 on the gate lines 3 through the adhesive films 50, the film 52 is released from the semiconductor films 8. As shown in FIG. 31, while the substrate 1 and a roller 54 move relative to each other, the film 52 is wrapped around the roller 54 and released from an end of the substrate 1. The roller 54 has an adhesive surface or has adhesive tape applied thereto, which enables the film 52 to be wrapped around the roller 54. The adherence of the film 52 has been reduced by heating or UV irradiation, and the adhesive films 50 have been hardened to have the gate insulating films 9 fixed thereto, wherefore the film 52 is separated from the semiconductor films 8. Since the film 52 is removed gradually from the semiconductor films 8, the semiconductor films 8 do not remain on the film 52. Step S20 corresponds to the second transfer step in this invention.

Figure 32:
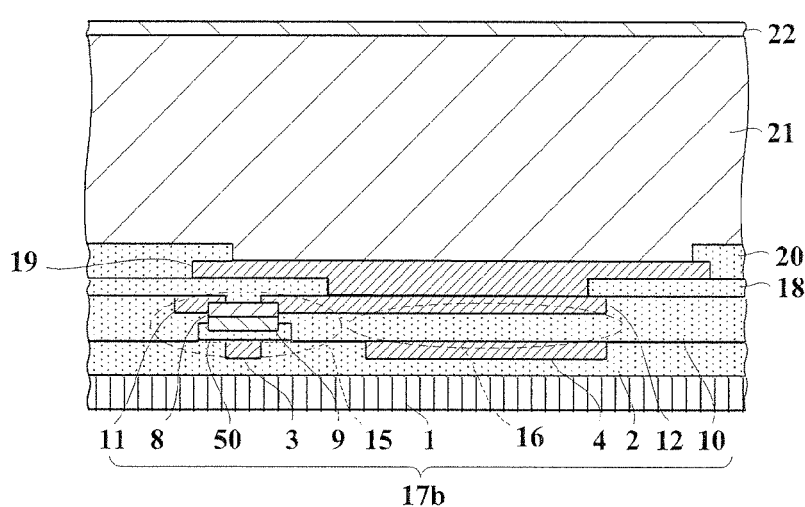
FIG. 32 is a view in vertical section showing the process of manufacturing the FPD according to Embodiment 3.

After step S20, as in Embodiment 1, step S22-step S29 are executed to form an X-ray detector as shown in FIG. 32. The active matrix substrate 17 in Embodiment 1, with the adhesive films 50 formed between the gate lines 3 and gate insulating films 9, corresponds to the active matrix substrate 17b in Embodiment 3.

The method of manufacturing the optical matrix device in Embodiment 3 continuously forms the gate insulating films 9 and semiconductor films 8 in a vacuum. Therefore, the interfaces between the gate insulating films 9 and semiconductor films 8 are never affected by contaminants such as organic contaminants or oxidized contaminants. Since traps at the interfaces between the gate insulating films 9 and semiconductor films 8 can be reduced, characteristics of TFTs 15 such as leak current value at times of gate OFF, ON/OFF current ratio and mobility have been improved, compared with TFTs formed by inkjet technique.

In Embodiment 3, two functional films consisting of the semiconductor films 8 and gate insulating films 9 are laminated on the transfer mold 5 in a vacuum, and these are transferred to the film 52 in the normal atmosphere, and are further transferred from the film 52 onto the gate lines 3. That is, the semiconductor films 8 and gate insulating films 9 are formed in a vacuum, but the wires need not be formed in a vacuum.

Even if the transfer mold 5 has a small area, the semiconductor films 8 and gate insulating films 9 can be laminated one after another on the transfer mold 5 inside a vacuum chamber, successively transferred to the film 52, and further transferred to predetermined positions on the gate lines 3. That is, even though the substrate 1 has a large area, the transfer mold 5 may be smaller than the substrate 1, which allows the vacuum chamber to have a reduced size. The method of manufacturing the optical matrix device in Embodiment 3 is desirable for manufacture of the image display device in Embodiment 2 also.

As described above, the semiconductor films 8 and gate insulating films 9 formed in a vacuum are transferred onto the gate lines 3 formed beforehand. Thus, even if the substrate 1 has a large area, the wires, the semiconductor films 8 and gate insulating films 9 of the thin-film transistors 15 can be formed efficiently. The FPD 27 also with excellent characteristics of the thin-film transistors 15 can be manufactured.

With the first transfer step for transferring the gate insulating films 9 and semiconductor films 8 laminated on the transfer mold 6 to the film 52, and the second transfer step for transferring the gate insulating films 9 and semiconductor films 8 transferred to the film 52 onto the gate lines 3 formed beforehand on the substrate 1, any omission in transferring the gate insulating films 9 and semiconductor films 8 can be prevented to improve the yield of transfer.

The film 52 has adherence reducible by heating or UV irradiation, and the second transfer step is executed with the adherence of the film 52 reduced by heating or UV irradiation. Therefore, at the time of transfer from the film 52 onto the gate lines 3, the gate insulating films 9 and semiconductor films 8 do not remain on the film 52.

This invention is not limited to the foregoing embodiments, but may be modified as follows.

Figure 33:
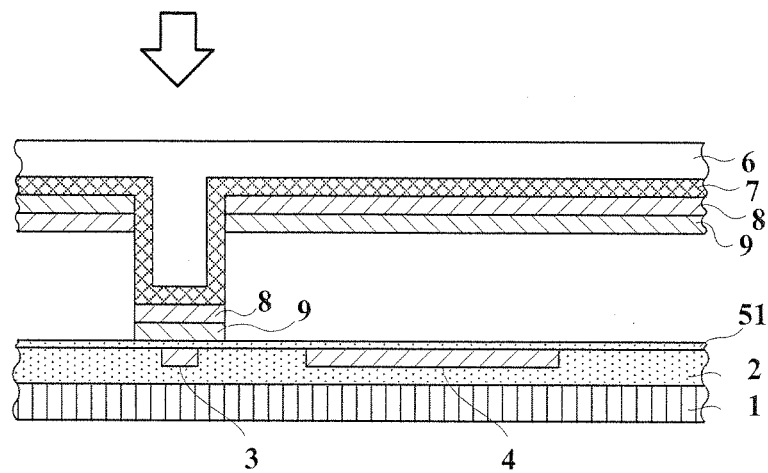
FIG. 33 is a view in vertical section showing a process of manufacturing an FPD according to a modified embodiment of this invention.

(1) In foregoing Embodiment 1, the release layer 7 is used for transfer of the semiconductor films 8 and gate insulating films 9. As shown in FIG. 33, an insulating adhesive film 51 of higher adherence than the release layer 7 may be formed on the insulating film 2. Softened polyimide is cited as an example of adhesive film 51. That is, the adhesive film 51 of polyimide is formed uniformly on the surfaces of the insulating film 2, gate lines 3 and ground lines 4, and the adhesive film 51 is softened by heating and the adherence of the release layer 7 is reduced by heating the release layer 7 at the time of transfer of the semiconductor films 8 and gate insulating films 9. Consequently, since the adherence of the adhesive film 51 is greater than that of the release layer 7, the gate insulating films 9 are laminated on the adhesive film 51, and the semiconductor layers 8 easily separate from the release layer 7.

(2) In the foregoing embodiments, the semiconductor films 8 and gate insulating films 9 are formed after forming the release layer 7 on the transfer mold 6. Since the adhesive strength of the surface of the transfer mold 6 is weak when the surface energy of the transfer mold 6 is small, transfer can be made only by giving vibration of ultrasonic wave, for example, without forming the release layer 7.

(3) In the foregoing embodiments, the gate lines 3 and ground lines 4 are formed by inkjet technique on the insulating film 2 patterned with the transfer mold 5. Instead of being limited to this, patterns can be formed on the insulating film 2 with a roll-to-roll transfer mold, and the gate lines 3 and ground lines 4 can be formed by Ni (nickel) plating.

Figure 34:
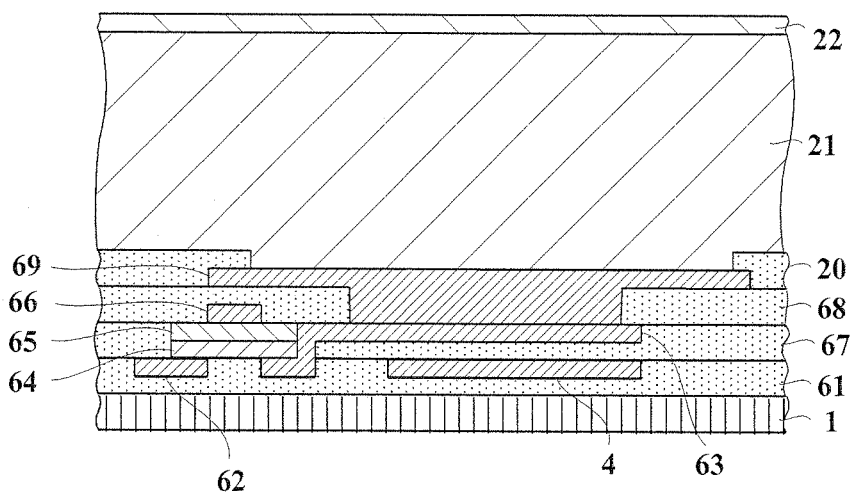
FIG. 34 is a view in vertical section showing the process of manufacturing an FPD according to the modified embodiment of this invention.

(4) In the foregoing embodiments, the optical matrix device has the TFTs of the bottom gate type. Instead, as shown in FIG. 34, the optical matrix device may have TFTs of the top gate type. In the case of TFTs of the top gate type, the order of laminating semiconductor films 64 and gate insulating films 65 on the transfer mold 6 is different from that in the foregoing embodiments. After forming the release layer 7 on the transfer mold 6, the gate insulating films 65 are first formed in a vacuum on the transfer mold 6, and the semiconductor films 65 are formed in the vacuum on the transfer mold 6 with the gate insulating films 65 laminated thereon. Next, the gate insulating films 65 and semiconductor films (gate channels) 64 are transferred onto part of data lines 62 and capacity electrodes 63 laminated through an insulating film 61 on the substrate 1. Then, gate lines 66 are formed on the gate insulating films 65. Thus, the data lines 62 correspond to the first wires in this invention. The capacity electrodes 63 correspond to the electrodes in this invention.

An insulating film 67 is formed between the ground lines 4 and capacity electrodes 63, and pixel electrodes 69 are formed on surfaces of the capacity electrodes 63. An insulating film 68 formed on surfaces of the gate lines 66 functions as passivation film of the TFTs. These methods of and materials for forming an optical matrix device are the same as those of the foregoing embodiments, and their description is omitted.

The invention claimed is:

1. A method of manufacturing an optical matrix device constructed with elements relating to light, having thin-film transistors, and arranged in a two-dimensional matrix form on a substrate, the method comprising:
   a semiconductor film forming step for laminating semiconductor films on a transfer mold in a vacuum;
   a gate insulating film forming step for laminating gate insulating films continuously, in the vacuum, on the transfer mold having the semiconductor films laminated thereon; and
   a transfer step for transferring the gate insulating films and the semiconductor films onto first wires formed on the substrate beforehand.

2. The method of manufacturing the optical matrix device according to claim 1, comprising:
   a first insulating film forming step for forming a first insulating film on the substrate;
   a first pattern forming step for forming grooves of a pattern of the first wires in the first insulating film by imprint technique; and
   a first wire forming step for forming, by inkjet technique, the first wires in the grooves of the first insulating film patterned;
   wherein the gate insulating films and the semiconductor films are transferred onto the first wires.

3. The method of manufacturing the optical matrix device according to claim 2, comprising:
   a second insulating film forming step for forming a second insulating film around the gate insulating films and the semiconductor films transferred onto the first wires;
   a second pattern forming step for forming grooves of a pattern of second wires in the second insulating film by imprint technique; and
   a second wire forming step for forming, by inkjet technique, the second wires in the grooves of the second insulating film patterned.

4. The method of manufacturing the optical matrix device according to claim 1, wherein a release layer is formed on the transfer mold before the semiconductor films are formed on the transfer mold.

5. The method of manufacturing the optical matrix device according to claim 4, wherein the release layer has adherence reducible by heating or UV irradiation.

6. The method of manufacturing the optical matrix device according to claim 1, wherein the first insulating film is an organic substance.

7. The method of manufacturing the optical matrix device according to claim 1, wherein the semiconductor films are oxide semiconductor films.

8. The method of manufacturing the optical matrix device according to claim 1, wherein the gate insulating films are an inorganic substance.

9. The method of manufacturing the optical matrix device according to claim 1, wherein the transfer step is executed repeatedly.

10. The method of manufacturing the optical matrix device according to claim 1, wherein the optical matrix device is a photodetector.

11. The method of manufacturing the optical matrix device according to claim 10, wherein the optical matrix device is a radiation detector.

12. The method of manufacturing the optical matrix device according to claim 1, wherein the optical matrix device is an image display device.

* * * * *